(12) United States Patent
Yan et al.

(10) Patent No.: US 8,723,201 B2
(45) Date of Patent: May 13, 2014

(54) LIGHT-EMITTING DEVICES WITH SUBSTRATE COATED WITH OPTICALLY DENSER MATERIAL

(75) Inventors: Chunhui Yan, El Monte, CA (US); Jianping Zhang, El Monte, CA (US)

(73) Assignee: InvenLux Corporation, El Monte, CA (US)

( * ) Notice: Subject to any disclaimer, the term of this patent is extended or adjusted under 35 U.S.C. 154(b) by 292 days.

(21) Appl. No.: 12/860,206

(22) Filed: Aug. 20, 2010

(65) Prior Publication Data
US 2012/0043568 A1   Feb. 23, 2012

(51) Int. Cl.
*H01L 33/58* (2010.01)

(52) U.S. Cl.
USPC ............... 257/98; 257/E33.067; 257/E33.068

(58) Field of Classification Search
USPC ............................. 257/98, E33.067, E33.068
See application file for complete search history.

(56) References Cited

U.S. PATENT DOCUMENTS

| | | | |
|---|---|---|---|
| 5,955,749 A | 9/1999 | Joannopoulos et al. | 257/98 |
| 6,229,160 B1 | 5/2001 | Krames et al. | 257/94 |
| 6,835,960 B2 * | 12/2004 | Lin et al. | 257/81 |
| 6,861,281 B2 | 3/2005 | Uemura et al. | 438/93 |
| 7,119,375 B2 | 10/2006 | Baik et al. | 257/98 |
| 7,166,870 B2 | 1/2007 | Erchak et al. | 257/86 |
| 7,173,289 B1 | 2/2007 | Wu et al. | 257/98 |
| 7,250,635 B2 | 7/2007 | Lee et al. | 257/98 |
| 7,355,210 B2 | 4/2008 | Ou et al. | 257/95 |
| 7,422,962 B2 | 9/2008 | Chen et al. | 438/456 |
| 7,483,212 B2 | 1/2009 | Cho et al. | 359/586 |
| 7,615,398 B2 | 11/2009 | McKenzie et al. | 438/65 |
| 7,642,108 B2 | 1/2010 | Krames et al. | 438/22 |
| 7,652,295 B2 | 1/2010 | Cho et al. | 257/79 |
| 7,652,299 B2 | 1/2010 | Urashima et al. | 257/95 |
| 7,687,813 B2 | 3/2010 | Nakamura et al. | 257/95 |
| 7,714,340 B2 | 5/2010 | Chua et al. | 257/98 |
| 2005/0093008 A1 * | 5/2005 | Suehiro et al. | 257/98 |
| 2007/0246700 A1 | 10/2007 | Park | 257/13 |
| 2008/0128731 A1 * | 6/2008 | DenBaars et al. | 257/98 |
| 2010/0032702 A1 | 2/2010 | Lahijani | 257/98 |

FOREIGN PATENT DOCUMENTS

| | | |
|---|---|---|
| EP | 1 225 643 | 7/2002 |
| JP | 11-26811 | 1/1999 |
| JP | 2008-141015 | 6/2008 |
| JP | 2010-103424 | 5/2010 |
| KR | 10-2008-0067536 | 7/2008 |

* cited by examiner

*Primary Examiner* — Wael Fahmy
*Assistant Examiner* — Sarah Salerno
(74) *Attorney, Agent, or Firm* — J.C. Patents (57) ABSTRACT

A light-emitting device includes a transparent substrate with a light emitting structure formed on one side of the substrate and a transparent layer formed on the opposing side of the substrate. The refractive index of the transparent layer is greater than the refractive index of the substrate. A light-emitting device includes a package cup having a reflective sidewall and a light emission surface and a light emitting diode (LED) embedded in the package cup. The LED comprises a transparent substrate and a transparent layer formed on the substrate. The reflective sidewall has a first portion in a central area of the package cup and a second portion in a peripheral area of the package cup, the first portion reflects light emitted from the transparent layer to the second portion and, then, the second portion further reflects the light received from the first portion to the light emission surface of the package cup.

16 Claims, 6 Drawing Sheets

LIGHT-EMITTING DEVICES WITH SUBSTRATE COATED WITH OPTICALLY DENSER MATERIAL

FIELD OF THE INVENTION

The present invention relates in general to light-emitting devices, and more particularly to light-emitting devices with substrate coated by optically denser material for enhanced light extraction.

DESCRIPTION OF THE RELATED ART

In recent years, solid-state light sources, such as light-emitting diodes (LEDs), are increasingly challenging traditional light sources due to their technological and economical advantages. Unlike traditional light sources, solid-state light sources generate light in a solid-state material, which usually possesses a refractive index, n, above 2, much larger than that of air or free space (n equal to 1). For example, in GaN-based visible LEDs, the light-emitting medium, InGaN, has a refractive index in the visible spectrum above 2.46 depending on the indium composition. This means that only a small portion of light generated within InGaN can escape from the optically denser medium to free space, because of the physical limitation set by total internal reflection and the associated light escape cones defined by critical angle. In the case of a traditional laminated GaN-based LED structure, only about 8% of the total generated light within the InGaN medium can escape to free space if no actions taken to relax the light extraction limitation.

In view of this, methods like surface roughening (e.g. U.S. Pat. Nos. 7,422,962, 7,355,210, aiming at reducing total internal reflection), LED chip side-wall shaping (e.g. U.S. Pat. Nos. 7,652,299, 6,229,160 aiming at increase light escape cone numbers), and photonic crystal incorporation (e.g. U.S. Pat. Nos. 5,955,749, 7,166,870, 7,615,398, 7,173,289, 7,642,108, 7,652,295, 7,250,635, aiming at enhancing spontaneous light generation rate and light extraction for specific wavelengths) were introduced in the prior art. Besides, another well-known approach to enhance light extraction efficiency (LEE) from optically denser medium to optically less dense medium is to insert a layer with graded-refractive index (GRIN). The GRIN layer in the prior art has an average refractive index smaller than that of the optical dense medium, but larger than that of the optically less dense medium. And it possesses gradual decreasing refractive index in the direction from the optically denser medium to the optically less dense medium, therefore maintaining a large critical angle for light extraction in-between neighboring layers. An example of GRIN design can be found in U.S. Pat. No. 7,483,212.

Meanwhile, light in the prior art LEDs is extracted mainly through one surface. Light directing to substrate is commonly redirected back to top surface by a reflector or mirror deposited on the top or backside of substrate. Or, alternatively, in flip-chip LEDs light directing to p-contact is reflected back to escape the chip by a reflective p-contact. The fabrication of a reflector on substrate can be found in the prior art, for example, in U.S. Pat. Nos. 7,119,375 and 6,861,281. And the fabrication of reflective p-contacts, for example, is shown in U.S. Pat. No. 7,714,340. Additionally, U.S. Pat. No. 7,687,813 presents a package design that enables light to be extracted from more than one main emitting surface, allowing light extracted to free space in the direction substantially parallel to the LED epilayer plane.

The GRIN approach described in the prior art, for example, in U.S. Pat. No. 7,483,212, follows Snell's law by gradually decreasing refractive index in the light propagation direction, making it possible for the light incident angle staying less than critical angles to avoid total internal reflection. This approach usually involves more than 4 optical interfaces to get desired LEE, resulting in complicated fabrication process.

The present invention discloses a new approach to enhance light extraction for light-emitting devices grown on transparent substrates, invoking as few as two optical interfaces for enhanced LEE.

SUMMARY OF THE INVENTION

One aspect of the present invention provides an approach to get improved light extraction efficiency from solid-state light emitting devices. In some embodiments, a light emission surface of a light emitting device is coated, or otherwise in contact, with a transparent optically denser material layer. The optically denser material layer possesses refractive index at least 10% higher than that of the light emission surface of the solid-state light emitting device. The difference in refractive index between the optically denser material and the light emission surface is selected so that all light is extracted from the emission surface into the optically denser material layer except for light due to the inevitable Fresnel loss (reflection loss). Light in the optically denser material layer is further extracted into free space or immersion medium via surface geometry arrangement of the optically denser material layer.

Another aspect of the present invention provides a light-emitting device, which comprises a transparent substrate and a light emitting structure deposited thereon, wherein the light-emitting structure is optically denser than the substrate, and additionally, there is an optically denser material layer covering the backside surface of the substrate. The optically denser material layer may have a patterned or roughened surface. The backside surface of the substrate may also be patterned or roughened.

Another aspect of the present invention provides a light-emitting device, which comprises a transparent substrate and a light emitting structure deposited thereon, wherein the light-emitting structure is optically denser than the substrate, and the backside surface of the substrate opposing the light-emitting structure is bonded to an optically denser material shaped for better LEE.

According to still another aspect of the present invention, an LEE-improved light-emitting device comprises a transparent substrate and a light emitting structure deposited thereon, wherein the light-emitting structure is optically denser than the substrate, and the backside surface of the substrate is covered with an optically denser material shaped for better LEE. The light emitting device further contains an optical element or package with optimized reflective inner mirrors to collect light from light emission surfaces of the light-emitting structure. The light emitting structure, the substrate and the optically denser material are embedded in the optical element or package. Light is transmitted to free space in the direction substantially perpendicular to the light-emitting structure's epilayer plane.

According to still another aspect of the present invention, a light-emitting device comprises a transparent substrate having a first surface and an opposing second surface; a light emitting structure formed over the first surface of the substrate; and a transparent layer formed on the opposing second surface of the substrate, wherein the second surface of the substrate is roughened, and the refractive index of the transparent layer is greater than the refractive index of the substrate. Preferably, the refractive index of the transparent layer is greater than that of the substrate by at least 5% or by at least 10%. Preferably, the second surface of the substrate is roughened to have a root mean square roughness greater than 50 nm. Preferably, the surface of the transparent layer is roughened to have a root mean square roughness greater than 50 nm. Preferably, the transparent layer is deposited on the second surface and made of a material selected from the group consisting of ITO, $SiN_x$, GaN, AlGaN, AlN, InAlGaN, ZnO, diamond, TiO2, SiC. Preferably, the transparent layer is made of ITO and the substrate is made of sapphire. Preferably, the transparent layer has a conical shaped surface and is bonded onto the second surface of the substrate. Preferably, the transparent layer is also formed on sidewalls of the substrate.

According to still another aspect of the present invention, a light-emitting device comprises a shaped package cup having a sloped reflective sidewall and a light emission surface; and a light emitting diode (LED) embedded in the shaped package cup with immersion medium, the LED comprising a transparent substrate, a light emitting structure formed over a first surface of the substrate, and a transparent layer formed on a second surface of the substrate; wherein the sloped reflective sidewall has a first portion in a central area of the package cup and a second portion in a peripheral area of the package cup, the first portion of the sloped reflective sidewall reflects light emitted from the transparent layer to the second portion of the sloped reflective sidewall and, then, the second portion further reflects the light received from the first portion to the light emission surface of the shaped package cup. Preferably, the first portion of the sloped reflective sidewall has a cone shape or a truncated cone shape. Preferably, an angle between light rays emitted from the transparent layer and the sloped reflective sidewall in the first portion is about 45 degrees. Preferably, the second portion of the sloped reflective sidewall has an inverted (truncated) cone shape. Preferably, an angle between light rays emitted from sidewalls of the LED and the sloped reflective sidewall in the second portion is about 45 degrees.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. Like numbers in the figures refer to like elements throughout, and a layer can refer to a group of layers associated with the same function.

DETAILED DESCRIPTION OF EMBODIMENTS

Figure 1:
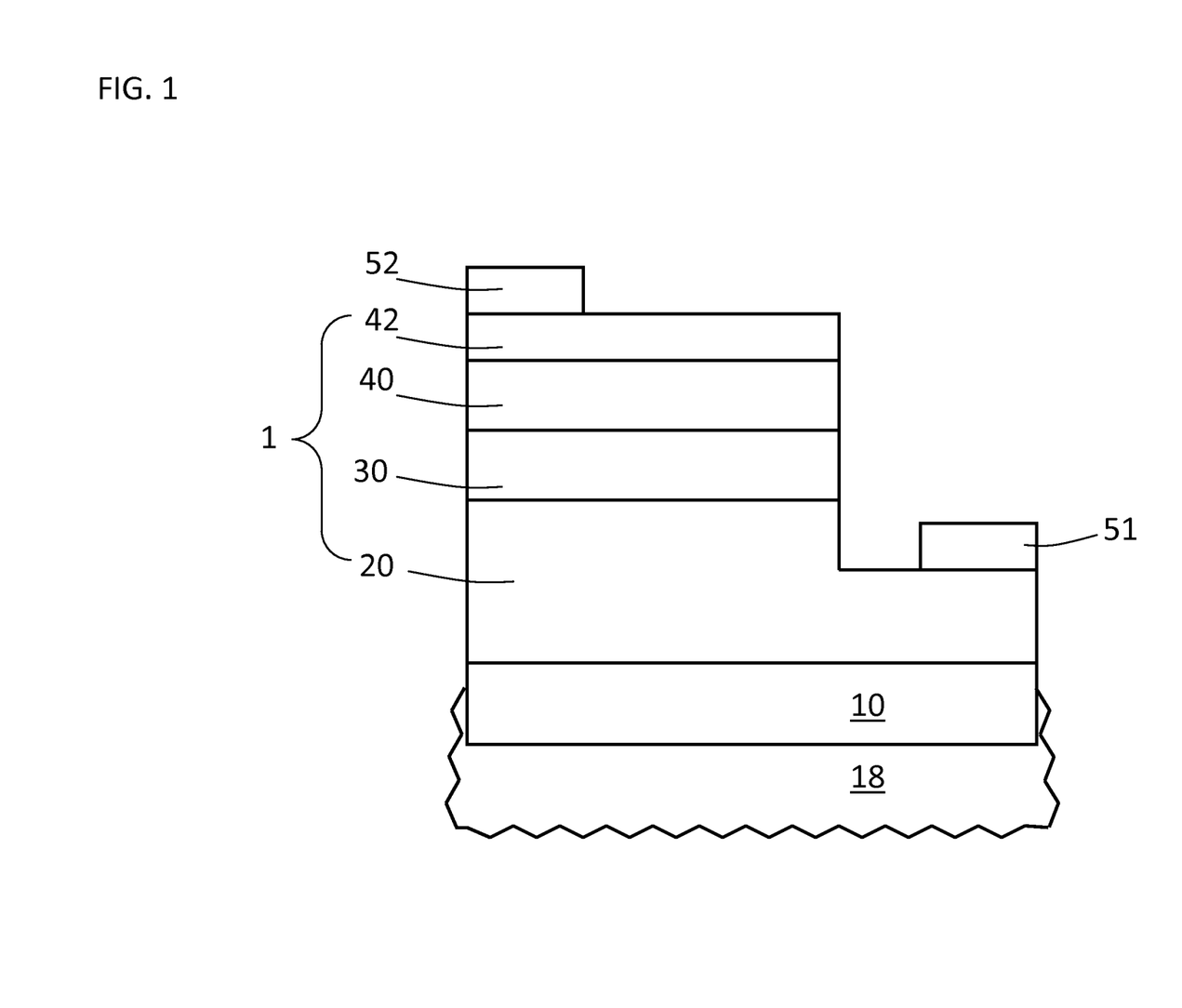
FIG. 1 illustrates a schematic cross-sectional view of an LED according to an embodiment of the present invention.

Shown in FIG. 1 is a schematic cross-sectional view of an LED device according to an embodiment of the present invention, wherein LED structure 1 is formed over a substrate 10 which is transparent to light generated by LED structure 1. In the case of GaN-based LEDs, substrate 10 prefers to be sapphire, GaN, AlN, InAlGaN, SiC, ZnO, and the like. LED structure 1 can be any conventional LED structure known in the art. LED structure 1 as shown in FIG. 1 comprises an n-type layer 20 formed over substrate 10, a p-type layer 40, and a light-emitting layer 30 sandwiched between n-type layer 20 and p-type layer 40. A transparent current spreading layer 42 is formed over p-type layer 40. A cathode contact pad 51 is formed on n-type layer 20 via standard lithography-etch process, an anode contact pad 52 is formed on current spreading layer 42. The light-emitting layer 30 can be a single InGaN layer or GaN/InGaN multiple-quantum-wells (MQW), and n-type layer 20 and p-type layer 40 can be Si-doped and Mg-doped GaN layers, respectively. Transparent current spreading layer 42 can be made of metal oxides such as indium tin oxide (ITO) and ZnO. On the backside and sidewalls of substrate 10 a transparent layer 18 is formed. The material of transparent layer 18 is an optically denser material compared to substrate 10, which means that the refractive index (n) of transparent layer 18 is larger than that of substrate 10, eliminating total internal reflection at the interface between transparent layer 18 and substrate 10 for light rays directing from layer 30 to substrate 10. The difference between the refractive indexes of substrate 10 ($n_{sub}$) and layer 18 ($n_{tran}$) is preferred to be larger than 5% (i.e., $(n_{tran}-n_{sub})/n_{sub} \geq 5\%$), more preferably to be larger than 10%. In some embodiments, substrate 10 is sapphire (n=1.76), therefore material of transparent layer 18 can be selected from ITO (n=2.1), $SiN_x$ (n=2.1-2.3), GaN (n=2.46), AlGaN (n=2.2-2.46), AlN (n=2.2), InAlGaN, ZnO (n=2.05), diamond (n=2.4), TiO2 (n=2.5), SiC (n=2.7), and the like. The surface of transparent layer 18 is preferred to be roughened or patterned, textured so that light has minimal total internal reflection when being extracted from layer 18 to the chip immersion ambient. Depending on the refractive index difference between layer 18 and the immersion medium, the roughness can have a RMS (root mean square) value not lower than 50 nm, preferably not lower than 200 nm, most preferably between 200 to 300 nm, or as high as 500 nm, when being measured by surface metrological tools such as atomic force microscopes. The microscopic feature of the roughened surface of layer 18 is preferred to be of inverted micron pyramids or cones.

Layer 18 can be formed before or after the formation of LED structure 1 on substrate 10, and it can be formed via electron beam deposition, sputtering, or chemical vapor deposition. In one embodiment, LED structure 1 is first formed on substrate 10 by metalorganic chemical vapor deposition. Then photoresistance film is used to protect the LED structure 1, and the rest surfaces of substrate 10, including backside surface and sidewall surface, are left exposed to ITO vapor in an electron beam deposition chamber for a predetermined period of time. The surface roughness of layer 18 can be obtained by wet chemical etching, or ion-coupled plasma dry etching via a predetermined patterning mask.

In another embodiment, layer 18 can be formed before the formation of LED structure 1 on substrate 10. In this case, substrate 10 is loaded into a metalorganic chemical vapor deposition reactor with its backside facing incoming reactants and its epi-ready surface (i.e., the front surface) facing down. By selecting appropriate metalorganic flow rates, layer 18, such as GaN, or AlGaN, or AlN layer, can be deposited on the backside surface of substrate 10. The roughness of layer 18 can be controlled by the deposition temperature and time. The preferred deposition temperature is from 400-1100° C., more preferably from 500-1000° C., more preferably from 600-800° C., to achieve rough nitride films on the backside surface of substrate 10.

Layer 18 has a thickness greater than the emission wavelength of LED structure 1. The thickness of layer 18 is preferably greater than 0.2 micron, more preferably greater than 0.5 micron, for example between 0.4-2.0 micron.

In the above embodiment, n-type layer 20 is formed on substrate 10. Alternatively, a p-type layer can be formed on substrate 10, and then a light emitting layer and an n-type layer are sequentially formed.

Figure 2:
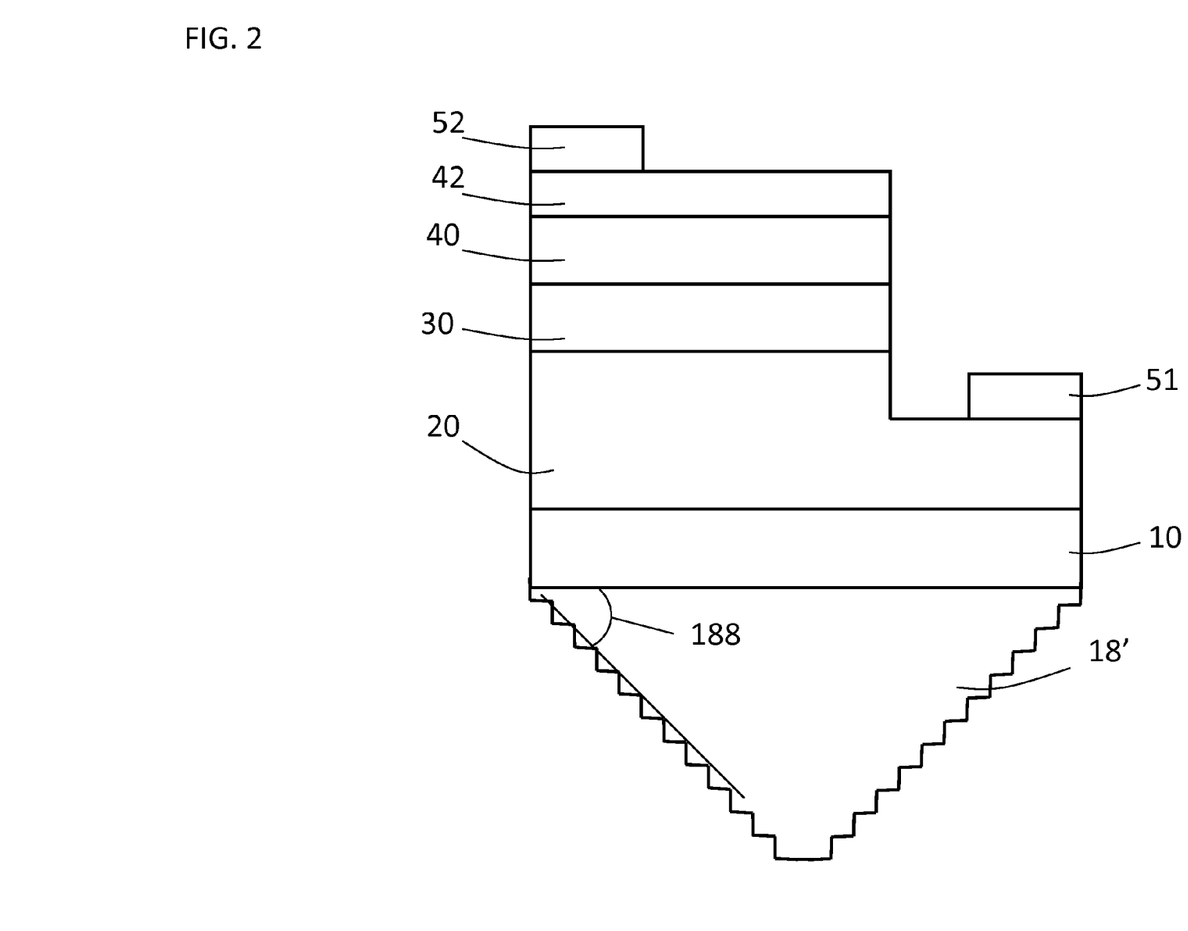
FIG. 2 illustrates a schematic cross-sectional view of an LED according to an embodiment of the present invention.

In another embodiment, layer 18 can be replaced by a shaped transparent bulk material 18' as shown in FIG. 2. Transparent bulk material 18' can be made from ZnO, sapphire, SiC, GaN, and the like with greater refractive index than that of substrate 10. Its surface is preferably roughened to further enhance LEE. The shape of transparent bulk material 18' is preferably to be an inverted pyramid or cone. The angle 188, formed by the base plane and the inclined plane of transparent bulk material 18' is preferred to be either not less than $(\pi/2-\theta_c)$, or not larger than $\theta_c$, where $\theta_c$ is the critical angle for light rays going from transparent bulk material 18' to its immersion medium. Transparent bulk material 18' can also be of hemisphere shape or other similar shapes. Transparent bulk material 18' is bonded to the backside surface of substrate 10 with an adhesive such as epoxy adhesive.

Figure 3:
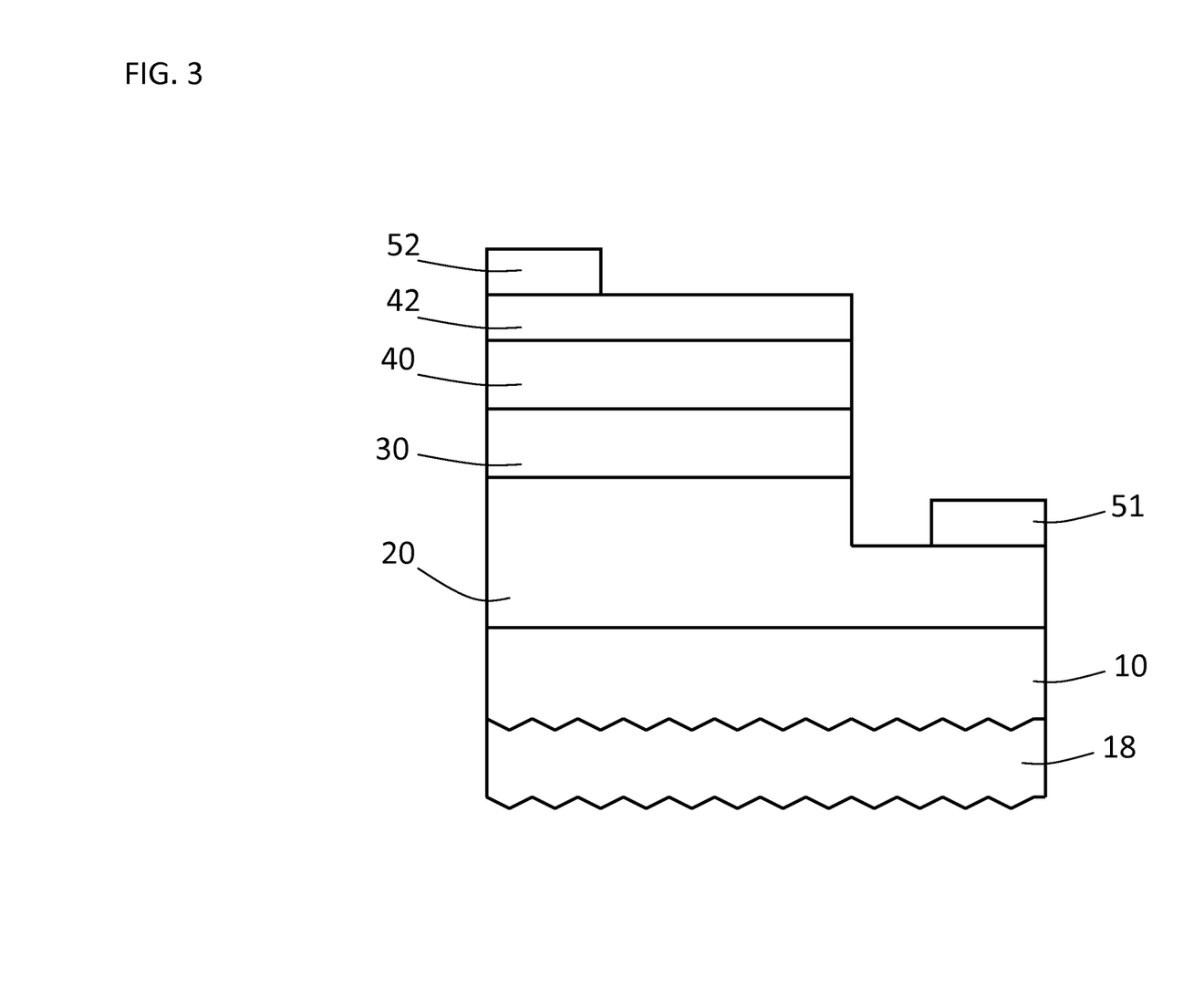
FIG. 3 illustrates a schematic cross-sectional view of an LED according to an embodiment of the present invention.

In another embodiment, the interface between substrate 10 and layer 18 is also roughened to have improved LEE, as schematically shown in FIG. 3. The backside surface of substrate 10 can be roughened by any conventional method known in the art.

Figure 4:
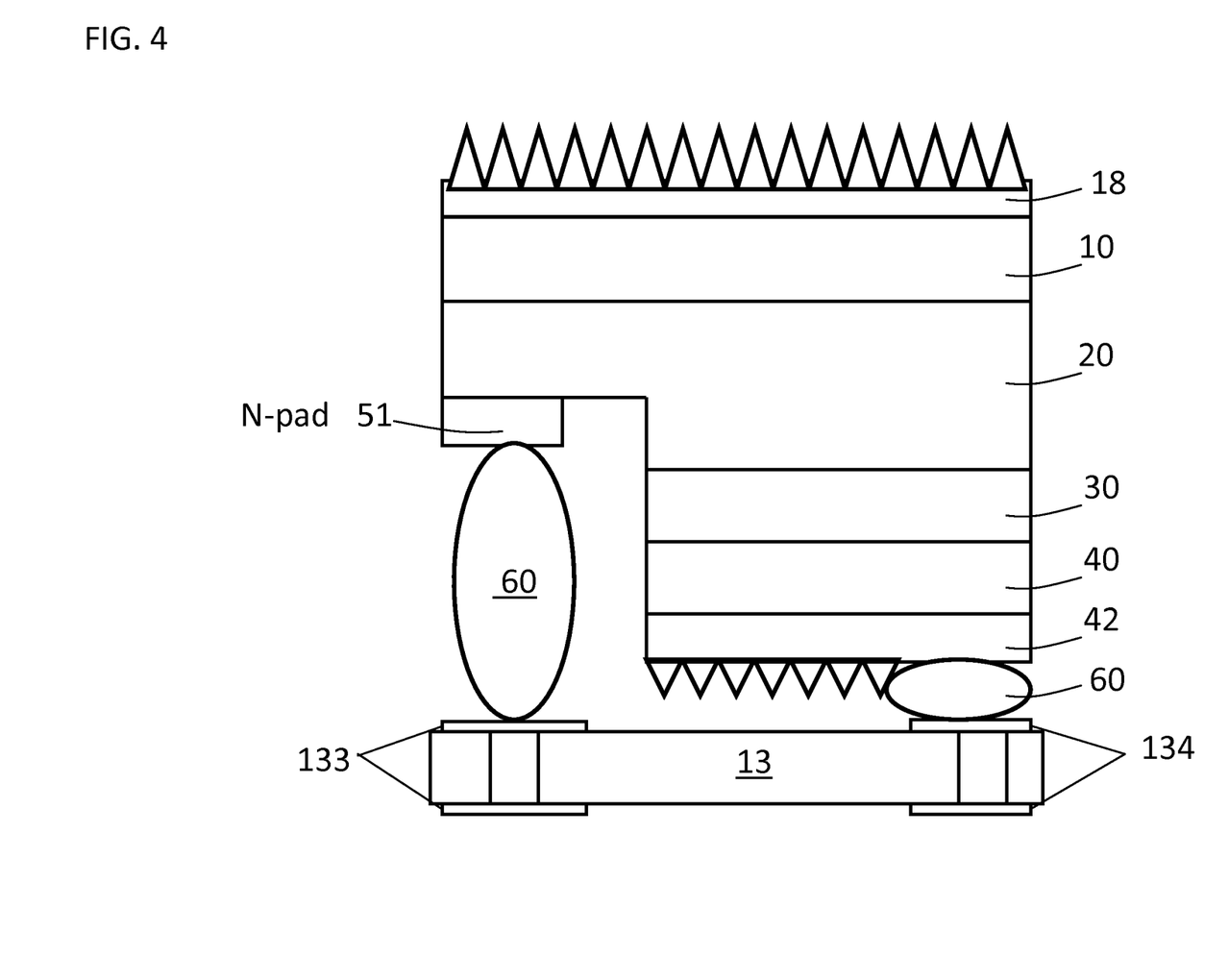
FIG. 4 illustrates a schematic cross-sectional view of an LED according to an embodiment of the present invention.

FIG. 4 illustrates a flip-chip LED device according to an embodiment of the present invention. The LED chip which has a structure similar to that shown in FIG. 1 is flipped onto a transparent sub-mount 13, which can be selected from the group of materials such as glass, quartz, sapphire, transparent plastics and the like. The metal pad pairs 133 and 134 formed on the sub-mount 13 provide electrical connection to the LED chip via the top pads and solder or gold bump 60 and external power source via the bottom pads. The pads in the pad pairs 133 and 134 are electrically connected respectively via the through-holes filled with metal as shown in FIG. 4. Substrate 10 is coated with optically denser transparent layer 18 with roughened surface, and the transparent conductive layer 42 is also preferred to have a roughened or textured surface. The whole chip, including the gaps between the sub-mount 13 and LED chip will be immersed in silicone or epoxy in the final packaging process to get improved LEE.

Figure 5:
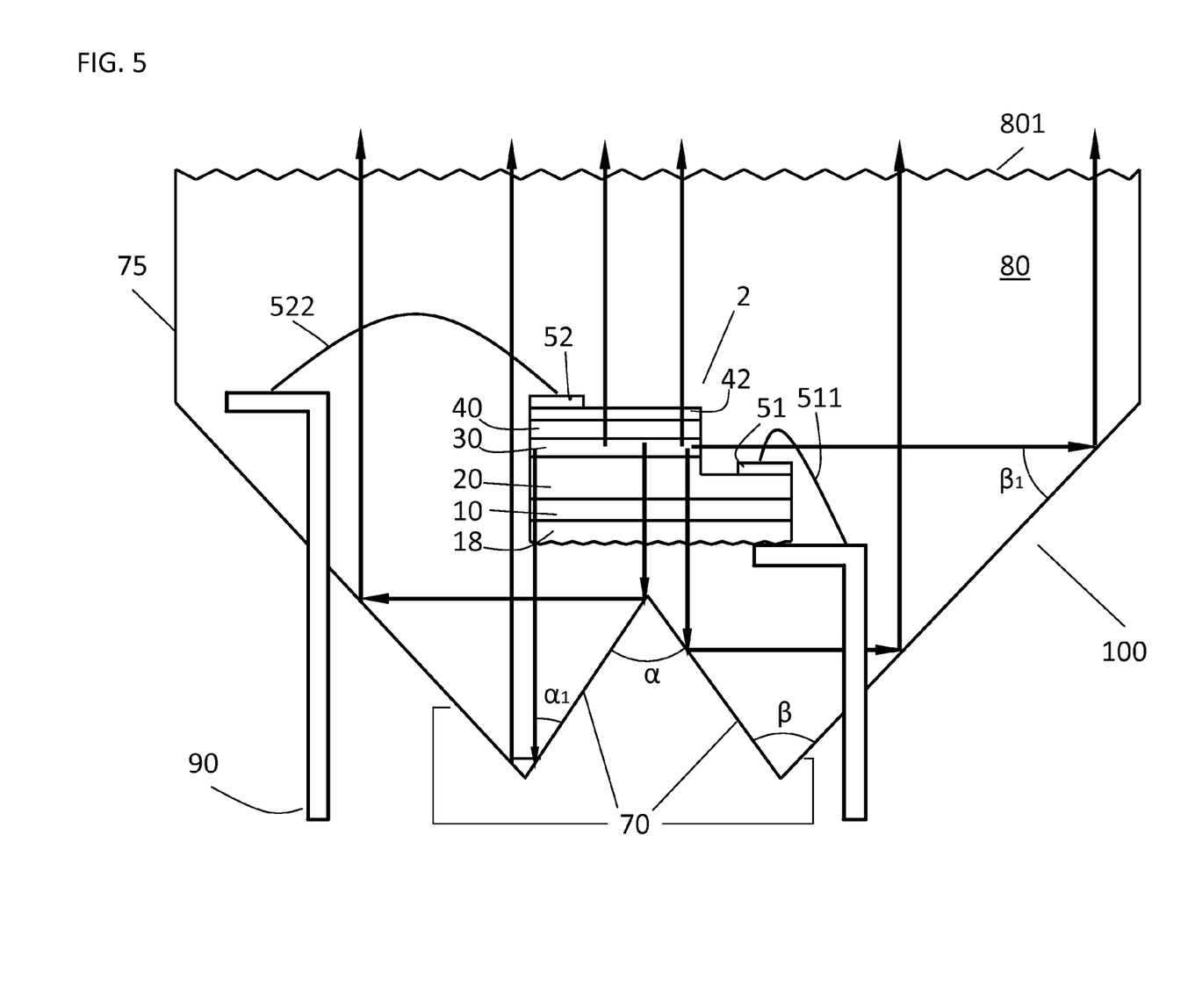
FIG. 5 illustrates a schematic cross-sectional view of a packaged LED according to an embodiment of the present invention.
Figure 6:
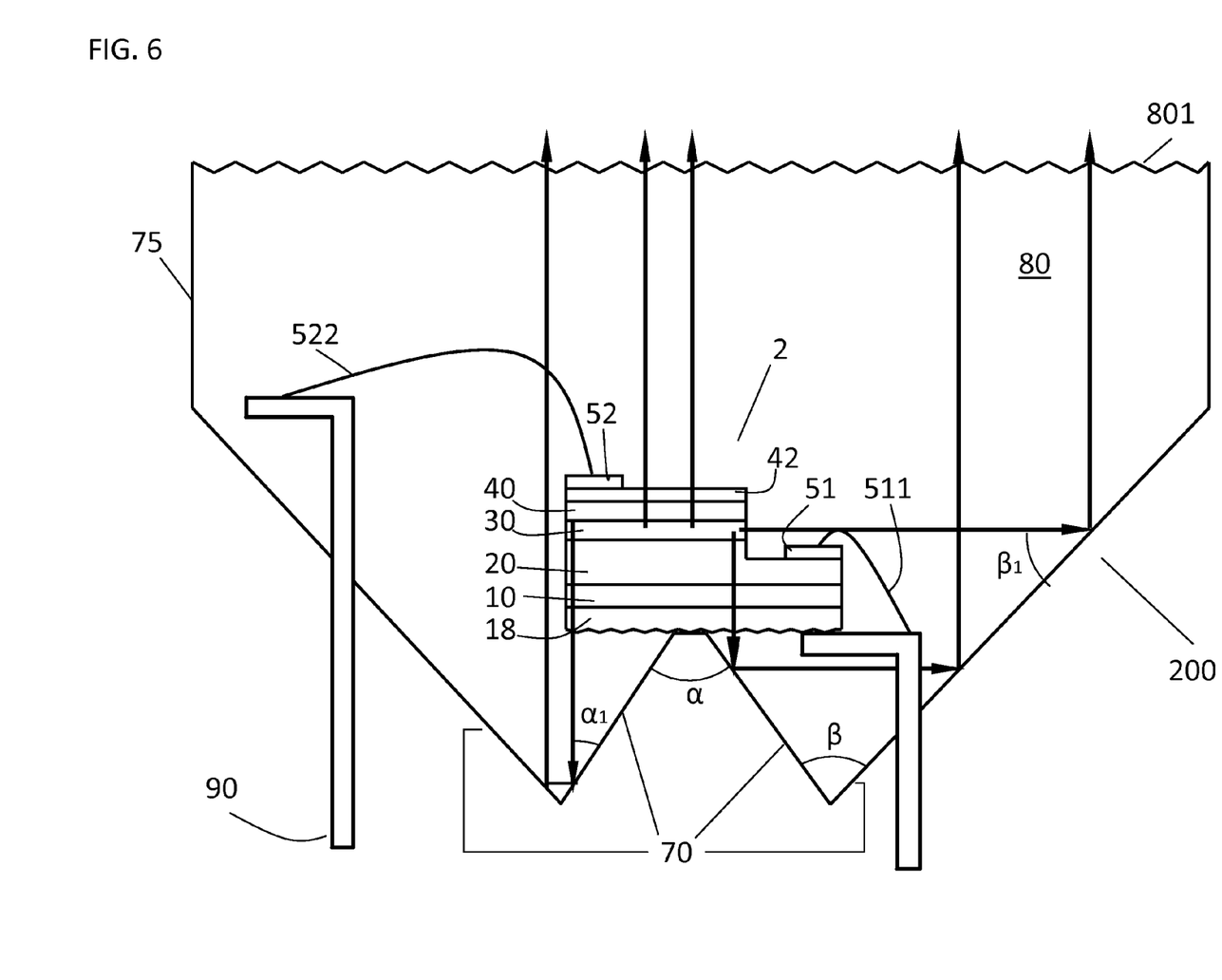
FIG. 6 illustrates a schematic cross-sectional view of a packaged LED according to an embodiment of the present invention.

The embodiments disclosed above emit light through at least two main surfaces. Disclosed in FIG. 5 and FIG. 6 are two packaging designs to collect light generated in the light emitting layer and transmit light out from a light emission surface of packages 100 and 200 in a direction as shown by the arrows. Packages 100 and 200 include an LED chip 2 according to the present invention or any conventional LED chip having a transparent substrate, an immersion medium 80, lead frames 90 and a package cup 75, respectively. In the package 100, LED chip 2 according to the present invention is immersed in immersion medium 80 such as silicone or epoxy formed in package cup 75. Cathode 51 and anode 52 of LED chip 2 are electrically connected to lead frames 90 through wires 511 and 522, respectively. Package cup 75 can be made from aluminum with polished inner surface for light reflection. Package cup 75 can also be formed from plastic materials with inner surface coated with aluminum or silver for light reflection. The immersion medium 80 formed in the package cup 75 has a light emission surface 801. And the package cup 75 has a sloped reflective sidewall 70. The sloped reflective sidewall 70 may have any proper shape so that light from the LED chip 2 is reflected toward light emission surface 801 by sloped reflective sidewall 70, not back to the LED chip 2. In the cross sectional view as shown in FIGS. 5 and 6, the sloped reflective sidewall 70 at the lower portion of package cup 75 has a "W" shape, enabling light rays generated from LED chip 2 to be transmitted upwards to light emission surface 801 in the direction substantially perpendicular to the light emitting plane of LED chip 2. Here the sloped sidewall 70 appears as a sloped straight line in different sections of the "W" shape, if desired, it can also be made such a shape appearing as a convexly or concavely curved line in different section of the "W" for focusing or diverging light to the light emission surface 801. The vertex angles α and β of the sloped reflective sidewall 70 of the package cup 75 at three vertexes of the "W" shape are selected to make sure that the light from the LED chip 2 is reflected toward light emission surface 801 by sloped reflective sidewall 70, not back to the LED chip 2. For example, the vertex angles α and β can be around 90 degree, respectively.

Generally speaking, sloped reflective sidewall 70 includes two portions, the first portion is in the central area and the second portion is in the peripheral area. The first portion of sloped reflective sidewall 70 reflects the light from the backside of LED chip 2 to the second portion of sloped reflective sidewall 70, while the second portion further reflects the light from the first portion to light emission surface 801 as shown by the arrows in FIGS. 5 and 6. To better reflect and transmit the light from the backside of LED chip 2, LED chip 2 is preferably placed above and within the first portion of sloped reflective sidewall 70, so that vertically downward emitting light from backside of LED chip 2 will fall within the boundary of the first portion of sloped reflective sidewall 70. Preferably, the angle $\alpha_1$ between the light rays emitted from transparent layer 18 and the sloped reflective sidewall 70 in the first portion is about 45 degrees. Preferably, the angle $\beta_1$ between the light rays emitted from the sidewalls of LED chip 2 and the sloped reflective sidewall 70 in the second portion is about 45 degrees. Angles $\alpha_1$, $\beta_1$, α, and β may have any value as long as light can be effectively reflected and transmitted from LED chip 2 to emission surface 801. Package cup 75 and sloped reflective sidewall 70 may have any proper shape as long as light can be effectively reflected and transmitted from LED chip 2 to emission surface 801. For example, sloped reflective sidewall 70 may have a cone shaped or pyramid shaped first portion in the central area for reflecting light from the backside of LED chip 2 to an inverted truncated cone shaped or inverted truncated pyramid shaped second portion in the peripheral area, and the inverted truncated cone shaped second portion reflects the light towards emission surface 801. Preferably, the second portion of sloped reflective sidewall 70 also directly reflects light laterally emitted from sidewalls of LED chip 2 to emission surface 801.

In FIG. 5, the first portion of sloped reflective sidewalls in the central area of package cup 75 is shown not in direct contact with transparent layer 18 in the backside of LED chip 2. In FIG. 6, sloped reflective sidewall 70 has a truncated cone shaped or a truncated pyramid shaped first portion and LED chip 2 sits on the top of the first portion of sloped reflective sidewall 70. Otherwise, the structure shown in FIG. 6 is identical to the structure shown in FIG. 5.

The present invention has been described using exemplary embodiments. However, it is to be understood that the scope of the present invention is not limited to the disclosed embodiments. On the contrary, it is intended to cover various modifications and similar arrangement or equivalents. The scope of the claims, therefore, should be accorded the broadest interpretation so as to encompass all such modifications and similar arrangements and equivalents.

What is being claimed is:

1. An unpacked chip for a light-emitting device comprising: a transparent substrate having a first surface, an opposing second surface and a sidewall connecting the first surface and the second surface; a light emitting structure formed over the first surface of the substrate, wherein the light emitting structure comprises a p-type layer, an n-type layer, and an active layer with the active layer being sandwiched between the p-type layer and the n-type layer and with the n-type layer facing the substrate; and a transparent layer formed directly on the opposing second surface and the sidewall of the substrate, but does not form on any part of the light emitting structure, wherein the refractive index of the transparent layer is greater than the refractive index of the substrate and the transparent layer is made of a material selected from the group consisting of ITO, SiNx, GaN, AlGaN, AlN, ZnO, diamond, TiO2, SiC.

2. The unpacked chip for a light-emitting device according to claim 1, wherein the refractive index of the transparent layer is greater than that of the substrate by at least 5%.

3. The unpacked chip for a light-emitting device according to claim 1, wherein the refractive index of the transparent layer is greater than that of the substrate by at least 10%.

4. The unpacked chip for a light-emitting device according to claim 1, wherein the second surface of the substrate is roughened to have a root mean square roughness greater than 50 nm.

5. The unpacked chip for a light-emitting device according to claim 1, wherein the surface of the transparent layer is roughened to have a root mean square roughness greater than 50 nm.

6. The unpacked chip for a light-emitting device according to claim 1, wherein the transparent layer is made of ITO and the substrate is made of sapphire, AlN, GaN, or InAlGaN.

7. The unpacked chip for a light-emitting device according to claim 1, wherein the transparent layer has a conical shaped surface and is bonded onto the second surface of the substrate.

8. A light-emitting device comprising: a shaped package cup having a sloped reflective sidewall and a light emission surface; and a light emitting diode (LED) embedded in the shaped package cup with immersion medium, the LED comprising a transparent substrate with a first surface, an opposing second surface and a sidewall connecting the first surface and the second surface, a light emitting structure formed over the first surface of the substrate, and a transparent layer which is directly formed on the second surface and the sidewall of the substrate, but does not form on any part of the light emitting structure, wherein the transparent layer is made of a material selected from the group consisting of ITO, SiN, GaN, AlGaN, AlN, ZnO, diamond, TiO2, SiC; wherein the sloped reflective sidewall has a first portion in a central area of the package cup and a second portion in a peripheral area of the package cup, the first portion of the sloped reflective sidewall reflects light emitted from the transparent layer to the second portion of the sloped reflective sidewall and, then, the second portion further reflects the light received from the first portion to the light emission surface of the shaped package cup, wherein the second portion of the sloped reflective sidewall defines a space and the LED is positioned within the space with sidewalls of the LED facing the second portion so that the second portion directly reflects light laterally emitted from the sidewalls of the LED to the light emission surface.

9. The light-emitting device according to claim 8, wherein the first portion of the sloped reflective sidewall has a cone shape or a truncated cone shape.

10. The light-emitting device according to claim 8, wherein an angle between light rays emitted from the transparent layer and the sloped reflective sidewall in the first portion is about 45 degrees.

11. The light-emitting device according to claim 8, wherein the second portion of the sloped reflective sidewall has an inverted truncated cone shape.

12. The light-emitting device according to claim 8, wherein an angle between light rays emitted from a front side of the LED and the sloped reflective sidewall in the second portion is about 45 degrees.

13. The light-emitting device according to claim 8, wherein the refractive index of the transparent layer is greater than that of the substrate by at least 5%.

14. The light-emitting device according to claim 8, wherein the refractive index of the transparent layer is greater than that of the substrate by at least 10%.

15. The light-emitting device according to claim 8, wherein the surface of the transparent layer is roughened to have a root mean square roughness greater than 50 nm.

16. The light-emitting device according to claim 8, wherein the transparent layer is made of ITO and the substrate is made of sapphire, AlN, GaN, or InAlGaN.

* * * * *